(12) United States Patent
Kobayashi et al.

(10) Patent No.: US 12,484,449 B2
(45) Date of Patent: Nov. 25, 2025

(54) SENSOR DEVICE AND METHOD FOR MANUFACTURING SENSOR DEVICE

(71) Applicant: CAST INC., Kumamoto (JP)

(72) Inventors: Makiko Kobayashi, Kumamoto (JP); Kei Nakatsuma, Kumamoto (JP); Masayuki Tanabe, Kumamoto (JP); Kyosuke Tsutsumi, Kumamoto (JP); Yuya Tanaka, Kumamoto (JP)

(73) Assignee: CAST INC., Kumamoto (JP)

( * ) Notice: Subject to any disclaimer, the term of this patent is extended or adjusted under 35 U.S.C. 154(b) by 365 days.

(21) Appl. No.: 18/255,036

(22) PCT Filed: Dec. 3, 2021

(86) PCT No.: PCT/JP2021/044524
§ 371 (c)(1),
(2) Date: Aug. 1, 2023

(87) PCT Pub. No.: WO2022/118965
PCT Pub. Date: Jun. 9, 2022

(65) Prior Publication Data
US 2024/0032430 A1    Jan. 25, 2024

(30) Foreign Application Priority Data
Dec. 4, 2020   (JP) .................. 2020-202072

(51) Int. Cl.
*H10N 30/30* (2023.01)
*G01H 11/08* (2006.01)
*H10N 30/87* (2023.01)

(52) U.S. Cl.
CPC ........... *H10N 30/302* (2023.02); *G01H 11/08* (2013.01); *H10N 30/875* (2023.02)

(58) Field of Classification Search
CPC .... H10N 30/302; H10N 30/875; H10N 30/06; G01H 11/08; G01N 29/04; G01N 29/245; G01N 29/28
(Continued)

(56) References Cited

U.S. PATENT DOCUMENTS

2004/0164650 A1   8/2004   Xu et al.
2005/0104479 A1   5/2005   Xu et al.
(Continued)

FOREIGN PATENT DOCUMENTS

| JP | H08-191835 A | 7/1996 |
|---|---|---|
| JP | H10-241762 A | 9/1998 |
| JP | 2002-340700 A | 11/2002 |
| JP | 2018-089621 A | 6/2018 |
| JP | 6432097 B2 | 12/2018 |
| JP | 2020068364 A | 4/2020 |
| WO | 2016/027615 A1 | 2/2016 |

OTHER PUBLICATIONS

Jeanne-Louise Shih, "Flexible Ultrasonic Transducers Using Ferroelectric Sol-gel Composite Films for Non-Destructive Testing and Structural Health Monitoring", Dec. 2012, Published by McGill University, Available online at https://escholarship.mcgill.ca/concern/theses/ff3658620 (Year: 2012).*
(Continued)

*Primary Examiner* — Peter J Macchiarolo
*Assistant Examiner* — John M Royston
(74) *Attorney, Agent, or Firm* — LUCAS & MERCANTI, LLP

(57) ABSTRACT

In a sensor device, a sensor unit and a wiring portion are connected. The sensor unit is configured as a sol-gel composite piezoelectric sensor including a base material layer, a piezoelectric film layer formed on the base material layer, an electrode layer formed on the piezoelectric film layer, and a protective layer. The base material layer and the electrode layer are covered by the protective layer except for a portion thereof. The wiring portion includes a signal line and a ground line. The signal line has an end having a pressure-
(Continued)

bonding tip. An upper housing portion and a lower housing portion cover at least uncovered portions of the sensor unit and the wiring portion. A pressure-applying portion presses the pressure-bonding tip in contact with a portion of the electrode layer that is not covered by the protective layer, so as to pressure-bond them.

6 Claims, 13 Drawing Sheets

(58) Field of Classification Search
USPC .......................................................... 73/658
See application file for complete search history.

(56) References Cited

U.S. PATENT DOCUMENTS

| | | |
|---|---|---|
| 2005/0162045 A1 | 7/2005 | Xu et al. |
| 2007/0251324 A1* | 11/2007 | Wado .................... B06B 1/0688 |
| | | 73/649 |
| 2009/0113685 A1 | 5/2009 | Xu et al. |

OTHER PUBLICATIONS

International Search Report dated Dec. 28, 2021, for the corresponding patent application No. PCT/JP2021/044524, with English translation.

* cited by examiner (a)

(b)

(c)

(a)

(b)

(a)

(b)

(c)

(d)

(a)

(b)

(a)

(b)

(c)

(a)

(b)

(c)

(a)

(b)

(c)

(a)

(b)

(c)

(a)

(b)

(a)

(b)

SENSOR DEVICE AND METHOD FOR MANUFACTURING SENSOR DEVICE

CROSS REFERENCE TO RELATED APPLICATION

This Application is a 371 of PCT/JP2021/044524 filed on Dec. 3, 2021, which, in turn, claimed priority of Japanese Patent Application No. 2020-202072 filed on Dec. 4, 2020, both of which are incorporated herein by reference.

TECHNICAL FIELD

The present invention relates to a sensor device and a method for producing such a sensor device, and relates to such a sensor device etc., having a structure in which a sensor unit is connected to a wiring portion.

BACKGROUND ART

The present inventors have proposed a sol-gel composite piezoelectric sensor (see Patent document 1 or the like).

Patent document 2 has disclosed a structure including wiring of a sol-gel composite piezoelectric sensor, etc.

CITATION LIST

Patent Literature

[Patent Document 1]
Japanese Patent Application Laid Open No. 2020-068364
[Patent Document 2]
Japanese Patent No. 6,432,097

SUMMARY OF INVENTION

Technical Problem

However, with a wiring connection structure described in Patent document 2, it can be conceived that such a wiring connection structure configured to ensure stability and durability such as mechanical strength or the like has the potential to degrade the flexibility of the sol-gel composite piezoelectric sensor.

It should be noted that there is no clear description in Patent document 1 with respect to such a structure including wiring, etc.

In order to solve such a problem, it is a purpose of the present invention to provide a sensor device, etc. suitable for providing wiring of a flexible sol-gel composite piezoelectric sensor.

Solution of Problem

A first aspect of the present invention relates a sensor device having a structure in which a sensor unit is connected to a wiring portion. The sensor unit is configured as a sol-gel composite piezoelectric sensor, and is provided with a piezoelectric film layer, an electrode layer formed on the piezoelectric film layer, and a protective layer. The electrode layer is covered by the protective layer except for a portion of the electrode layer. A portion of the electrode layer that is not covered by the protective layer is flat. The wiring portion includes a signal line. The signal line is structured with an end including a pressure-bonding tip having a flat portion. A housing portion is provided so as to cover a portion of the electrode layer that is not covered by the protective layer and an uncovered portion of the signal line. The housing portion is provided with a pressure-applying portion configured to press the flat portion of the pressure-bonding tip to the portion of the electrode layer that is not covered by the protective layer so as to provide pressure bonding.

A second aspect of the present invention relates the sensor device according to the first aspect. The sensor unit includes a base material layer. The piezoelectric film layer is formed on the base material layer. The base material layer is covered by the protective layer except for a portion of the base material layer. The wiring portion includes a ground line. The ground line is electrically connected to a portion of the base material layer that is not covered by the protective layer.

A third aspect of the present invention relates the sensor device according to the first or second aspect. The wiring portion has one end electrically connected to the sensor unit, and the other end electrically connected to an extended wiring portion. The sensor unit, the wiring portion, and the pressure-applying portion each have a heat-resistance temperature that is higher than the heat-resistance temperature of the extended wiring portion.

A fourth aspect of the present invention relates the sensor device according to any one of the first through third aspects. The sensor device includes an attachment unit structured to cover at least the sensor unit. The attachment unit includes an attachment portion to be attached to a target object.

A fifth aspect of the present invention relates the sensor device according to the fourth aspect. The attachment unit is structured to ensure transmission of ultrasonic waves between the target object and the sensor unit via the attachment unit, and includes an adjustment unit configured to adjust the connection between the attachment unit and the sensor unit. The adjustment unit includes a cutoff portion structured to cut off reflected waves from the adjustment unit.

A sixth aspect of the present invention relates to a method for manufacturing a sensor device having a structure in which a sensor unit is connected to a wiring portion. The sensor unit is configured as a sol-gel composite piezoelectric sensor, and is provided with a piezoelectric film layer, an electrode layer formed on the piezoelectric film layer, and a protective layer. The electrode layer is covered by the protective layer except for a portion of the electrode layer. A portion of the electrode layer that is not covered by the protective layer is flat. The wiring portion includes a signal line. The signal line is structured with an end including a pressure-bonding tip having a flat portion. The method includes: housing, in which a housing portion provided to the sensor device is applied so as to cover a portion of the electrode layer that is not covered by the protective layer and an uncovered portion of the signal line; and pressing, in which the a pressure-applying portion provided to the housing portion is applied so as to press the flat portion of the pressure-bonding tip to the portion of the electrode layer that is not covered by the protective layer so as to provide pressure bonding.

A seventh aspect of the present invention relates to the method according to the sixth aspect. The sensor unit includes a base material layer. The piezoelectric film layer is formed on the base material layer. The base material layer is covered by the protective layer except for a portion of the base material layer. The wiring portion includes a ground line. The ground line is electrically connected to a portion of the base material layer that is not covered by the protective layer.

An eighth aspect of the present invention relates to the method according to the sixth or seventh aspect. The wiring portion has one end electrically connected to the sensor unit, and the other end electrically connected to an extended wiring portion. The sensor unit, the wiring portion, and the pressure-applying portion each have a heat-resistance temperature that is higher than the heat-resistance temperature of the extended wiring portion.

A ninth aspect of the present invention relates to the method according to any one of the sixth through eighth aspects. The sensor device includes an attachment unit structured to cover at least the sensor unit. The attachment unit includes an attachment portion to be attached to a target object.

A tenth aspect of the present invention relates to the method according to the ninth aspect. The attachment unit is structured to ensure transmission of ultrasonic waves between the target object and the sensor unit via the attachment unit, and includes an adjustment unit configured to adjust the connection between the attachment unit and the sensor unit. The adjustment unit includes a cutoff portion structured to cut off reflected waves from the adjustment unit.

Advantageous Effects of Invention

With the present invention, this allows a predetermined distance to be provided between the sensing portion and the wiring connection portion, thereby maintaining flexibility. Furthermore, this provides both heat resistance and mechanical strength using the housing portion and the pressure-applying portion.

DESCRIPTION OF EMBODIMENTS

Description will be made with reference to drawings regarding embodiments of the present invention.

Figure 1:
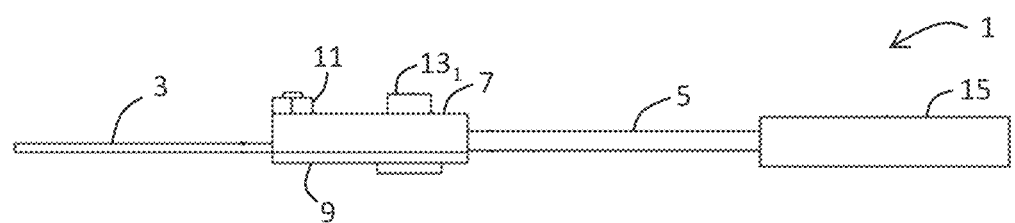
FIG. 1 is a diagram showing an external view of a sensor device 1 according to the present invention.
Figure 1:
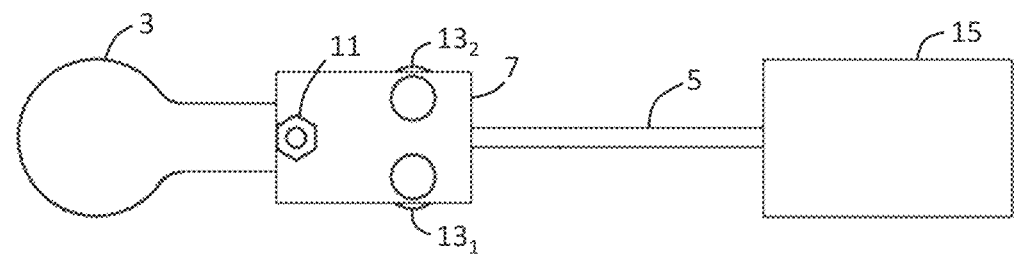
Figure 1:
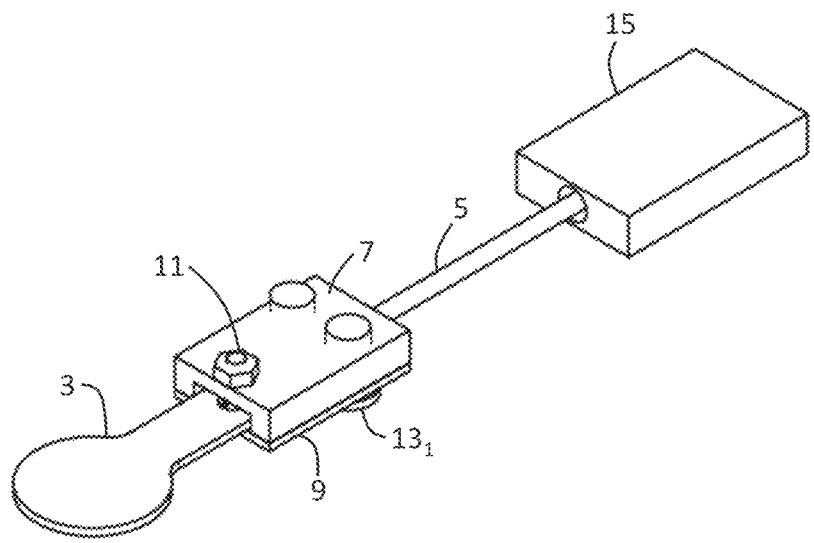

FIG. 1 is an external view of a sensor device 1 according to the present invention. The sensor device 1 has a configuration in which a sol-gel composite piezoelectric device is provided with wiring. This allows such a sol-gel composite piezoelectric device to be employed as a pipe wall thickness sensor (ultrasonic probe), pipe clogging sensor, pressure/vibration sensor, etc., having heat resistance of up to 600° C. and flexibility with a radius of curvature on the order of 10 mm.

A sol-gel composite piezoelectric sensor is configured as a piezoelectric ceramic device having flexibility and heat resistance (thermal shock resistance). Examples of usages of the sol-gel composite piezoelectric sensor include: wall thickness monitoring; pipe clogging detection; pressure/vibration monitoring; and monitoring of destruction occurring in a structure as an AE (Acoustic Emission) sensor.

The present inventors have advanced development or the like for verifying advantages in heat resistance, flexibility, etc., of sol-gel composite piezoelectric sensors and for providing a manufacturing process for manufacturing such sensors. A sol-gel composite piezoelectric sensor is expected to be employed as an edge sensor that is necessary for providing the IoT in factories. In particular, a sol-gel composite piezoelectric sensor is expected to be applied to locations where it is difficult to apply a conventional sensor, such as a high-temperature location, a narrow space, etc. In order to commercialize such a sensor, it is necessary to provide wiring or the like to a sensor with practical durability without damaging heat resistance.

FIGS. 1A and 1B are diagrams showing the sensor device 1 as viewed from the side and the top, respectively. FIG. 1C is a perspective view of the sensor device 1.

Referring to FIG. 1, the sensor device 1 includes a sensor unit 3, a wiring portion 5, an upper housing portion 7, a lower housing portion 9, a pressure-applying portion 11, fixing portions $13_1$ and $13_2$, and a wiring connector portion 15.

The sensor unit 3 is configured as a sol-gel composite piezoelectric device, for example (see Patent document 1 etc.).

The wiring portion 5 is configured as heat-resistant wiring. For example, the wiring portion 5 is configured as a wiring member such as MI cable or the like having heat resistance. The distance from the sensor unit 3 to a place where room-temperature wiring can be used changes depending on the use environment of the sensor device 1. In order to solve such a problem, a high-temperature portion is provided with heat-resistant wiring.

A portion that couples the sensor portion 3 and the wiring portion 5 is covered by the upper housing portion 7 and the lower housing portion 9 (a combination of them functions as an example of a housing portion) such that it is interposed between upper housing portion 7 and the lower housing portion 9. The fixing portions $13_1$ and $13_2$ fix the upper housing portion 7 and the lower housing portion 9. The upper housing portion 7 and the lower housing portion 9 are each configured as a connector for providing improved connection strength. With this, the sensor unit 3 and the wiring portion 5 are fixed using a method (pressure bonding, welding, etc.) that ensures mechanical strength. The pressure-applying portion 11 is arranged to apply pressure to a portion in which the wiring portion 5 is attached to the sensor unit 3 so as to pressure-bond the wiring portion 5 and the sensor unit 3.

The sensor unit 3, the wiring portion 5, the upper housing portion 7, the lower housing portion 9, the pressure-applying portion 11, and the fixing portions $13_1$ and $13_2$ are used in a high-temperature environment (at a temperature that is room temperature or higher and not more than 600° C.)

The wiring connector portion 15 is configured as a connector to support room-temperature wiring to be used as wiring extended from the room-temperature portion. The wiring extension portion is connected to the wiring connector portion 15. The sensor device 1 is configured such that the heat-resistant wiring is used as wiring for a high-temperature portion, and the room-temperature wiring is used as a wiring extension from the room-temperature portion. This is because, typically, room-temperature wiring has cable performance such as noise resistance, flexibility, distance attenuation in electric signal transmission, etc., which is advantageous in signal transmission. The wiring connector portion 15 is configured as a connector (bonding portion) for bonding the high-temperature wiring and the room-temperature wiring. It should be noted that, instead of the wiring connector portion 15, the wiring portions may be directly coupled by soldering or pressure bonding.

Figure 2:
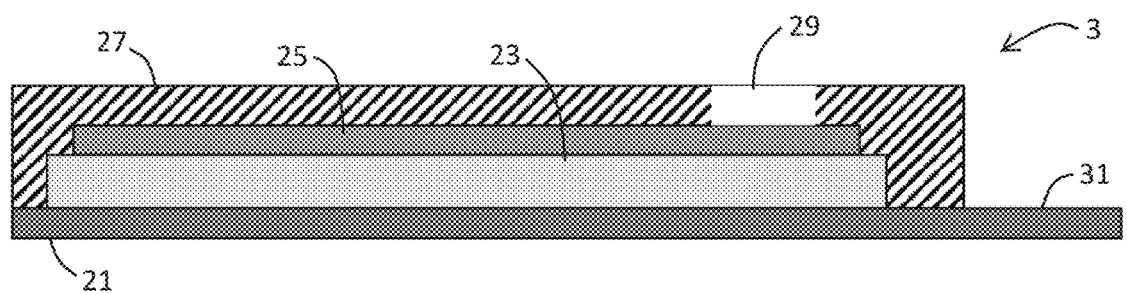
FIG. 2 is a diagram for explaining a specific configuration of a sensor unit 3 and a specific configuration of a connection portion.
Figure 2:
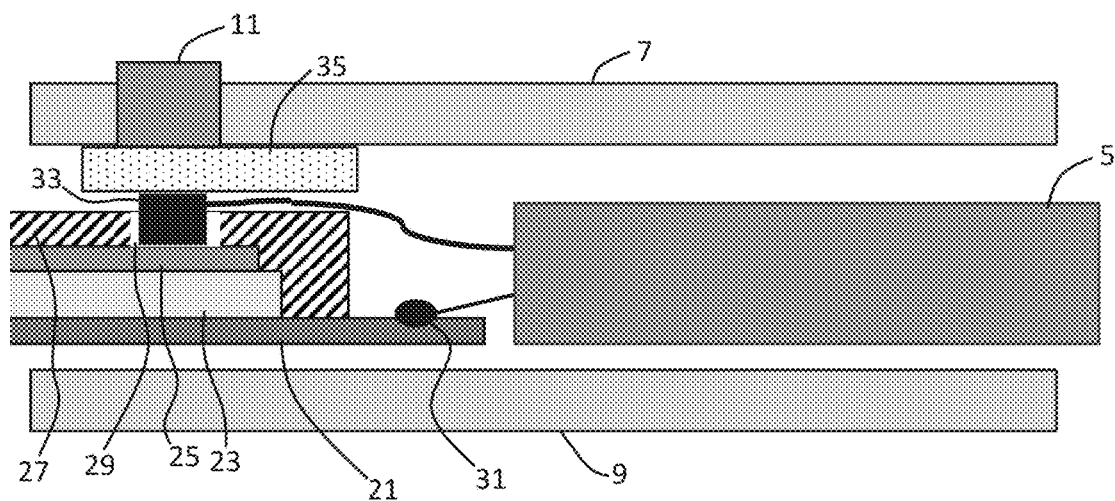
Figure 3:
FIG. 3 is a first diagram showing an example of a process used to actually manufacture the sensor device.
Figure 3:
Figure 3:
Figure 3:
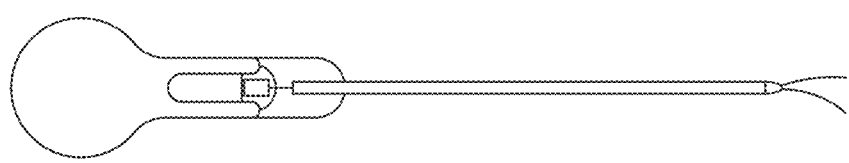
Figure 4:
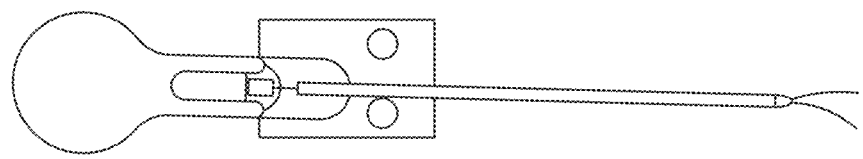
FIG. 4 is a second diagram showing an example of a process used to actually manufacture the sensor device.
Figure 4:
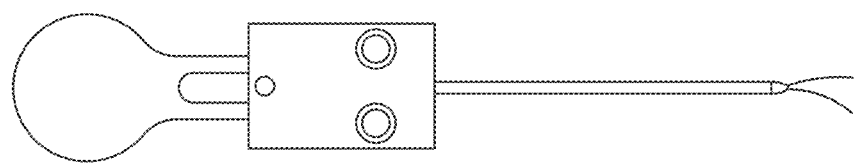
Figure 5:
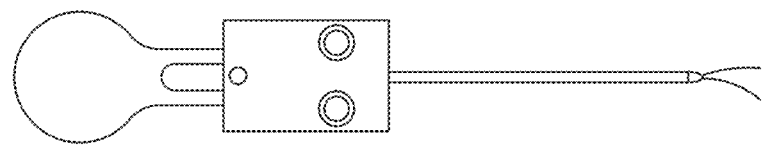
FIG. 5 is a third diagram showing an example of a process used to actually manufacture the sensor device.
Figure 5:
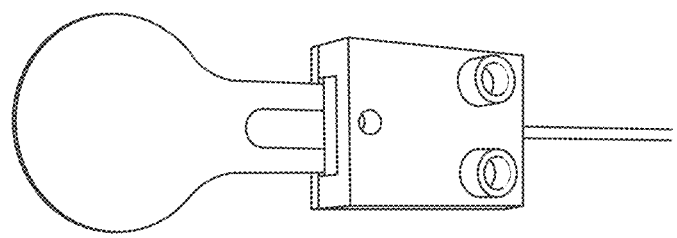
Figure 5:
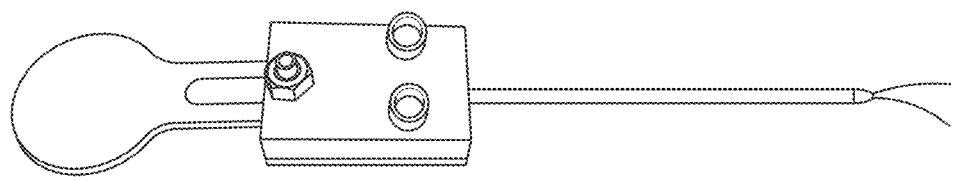
Figure 6:
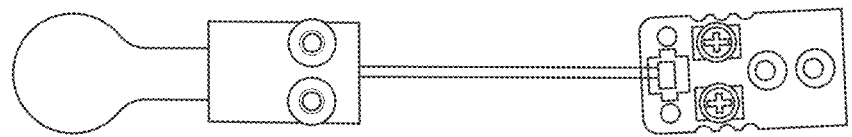
FIG. 6 is a fourth diagram showing an example of a process used to actually manufacture the sensor device.
Figure 6:
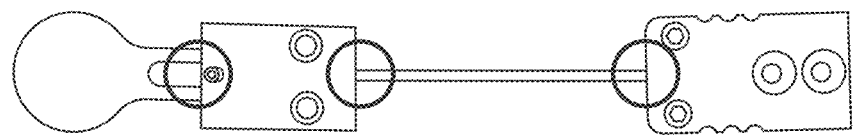
Figure 6:
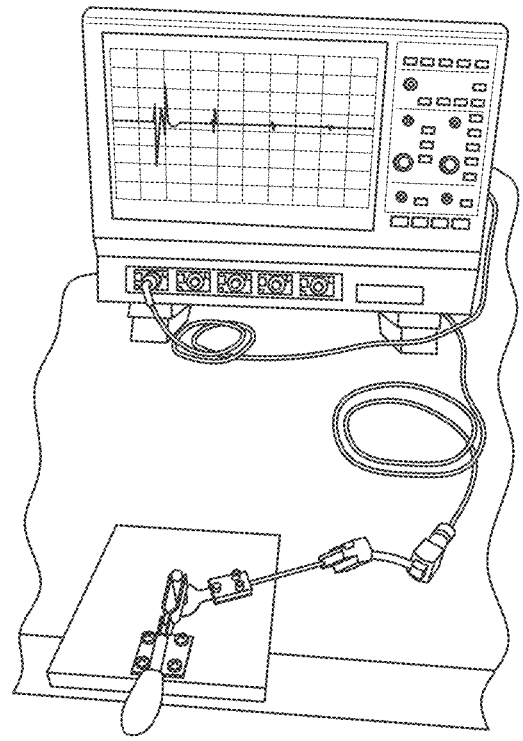

FIG. 2 is a diagram for specifically explaining each configuration of (a) the sensor unit 3 and (b) the connection portion. It should be noted that each component that corresponds to the corresponding component in FIG. 1 is denoted by the same reference symbol. However, for specific explanation of each component, its thickness is expanded or reduced.

Referring to FIG. 2A, the sensor unit 3 includes a base material layer 21, a piezoelectric film layer 23, an electrode layer 25, and a protective layer 27. The sensor unit 3 includes a piezoelectric film that functions as a core component of the sol-gel composite piezoelectric sensor. The sensor unit 3 acquires a physical signal to be used for ultrasonic transmission/reception, a pressure sensor, a vibration sensor, an AE sensor, or the like.

The base material layer 21 is formed of a material selected from among materials having conductivity and heat resistance that allows it to withstand firing and use at a temperature of 600° C. or higher. For example, the base material layer 21 is formed of a stainless steel material or the like.

The piezoelectric film layer 23 is configured as a porous piezoelectric ceramic film formed on the base material layer 21. The piezoelectric film layer 23 can be formed by coating with a ceramic powder such as lead zirconate titanate (PZT), bismuth titanate (BiT), lithium niobate, or the like, and a sol-gel solution that is a precursor such as PZT, BiT, titanic acid, or the like, using a sol-gel spray method or the like, and firing them.

The electrode layer 25 is configured as a pattern formed of a conductive material on the piezoelectric film layer 23. For example, such a pattern may be formed of a conductive material such as silver, aluminum, titanium, platinum, or the like, using screen printing, evaporation, sputtering, or other printing methods.

The protective layer 27 is configured in order to protect the surfaces of the piezoelectric film layer 23 and the electrode layer 25. For example, the protective layer 27 can be formed by coating the surfaces with a silicone material, rubber material, ceramic material, or the like. Basically, the protective layer 27 covers the entire region of the sensor unit 3. However, in order to allow the signal line and the ground line to be connected, the protective layer 27 is not formed on a part of the electrode layer 25 and the base material layer 21.

The ground line attachment portion 31 is configured as a portion to which the ground line is to be attached. The ground line attachment portion 31 is arranged in a portion in which the protective layer 27 is not formed on the base material layer 21.

The signal line attachment portion 29 is configured as a portion to which the signal line is to be attached. The signal line attachment portion 29 is configured as a portion in which the electrode layer 25 is exposed to the exterior without being covered by the protective layer 27.

Referring to FIG. 2B, the upper housing portion 7 and the lower housing portion 9 are configured to cover a portion in which the sensor unit 3 and the wiring portion 5 are coupled such that it is interposed between the upper housing portion 7 and the lower housing portion 9. The sensor unit 3 is configured in a shape that is similar to a rice scoop. The ground line attachment portion 31 and the signal line attachment portion 29 are formed in a portion that corresponds to the handle of the rice scoop. On the other hand, a portion having a shape that extends like a spatula is covered by the protective layer 27. The upper housing portion 7 and the lower housing portion 9 are arranged such that they cover at least the ground line attachment portion 31 and the signal line attachment portion 29. In the sensor unit 3, a portion that is not covered by the upper housing portion 7 and the lower housing portion 9 is covered by the protective layer 27. The upper housing portion 7 and the lower housing portion 9 are arranged such that they cover at least an uncovered signal line and an uncovered ground line. A portion of the wiring portion 5 that is not covered by the upper housing portion 7 and the lower housing portion 9 is configured as a covered portion.

The wiring portion 5 includes the ground line and the signal line.

The ground line is electrically connected to the ground line attachment portion 31 of the base material layer 21. In the sensor device 1, the ground line is connected using the base material layer 21 as an electrode. The base material layer 21 is formed of a conductive material (stainless steel material or the like). The ground line is electrically connected to the base material layer 21 by welding, pressure bonding, eyelet punching, soldering, or the like.

A conductive pressure-bonding tip 33 is attached to the end of the signal line by welding, soldering, or the like. The electrode layer 25 is configured as a flat layer. Accordingly, the pressure-bonding tip 33 having a flat portion is used such that it is pressed in contact with the electrode layer 25 using a pressure-applying device, thereby providing pressure bonding. The pressure-bonding tip 33 is smaller than a portion of the signal attachment portion 29 in which the electrode layer 25 is exposed. In a state in which the pressure-bonding tip 33 is applied to the signal line attachment portion 29, the pressure-applying portion 11 pressure bonds the pressure-bonding tip 33 to the electrode layer 25 via the insulating layer 35. The pressure-applying portion 11 can be provided as a pressure-applying device such as a screw or the like, for example, giving consideration to heat resistance, mechanical strength (stability), installation workability, etc. It should be noted that, in a case in which the pressure-applying device and the lower housing portion and the upper housing portion, etc., for holding the pressure-applying device are formed of a conductive material such as a stainless steel material or the like, an insulating layer is provided using a mica sheet, ceramic sheet, or the like in order to provide insulation.

As described with reference to FIGS. 1 and 2, an arrangement including the upper housing portion 7, the lower housing portion 9, the pressure-applying portion 11, and the fixing portions $13_1$ and $13_2$ allows the sensor unit 3 configured as an electrode portion and the heat-resistant wiring portion 5 to be connected in a stable manner without damaging heat resistance and workability. In particular, in addition to an electrical connection (by welding, pressure bonding, or the like) with mechanical strength between the ground line configured as heat-resistant wiring and the base material layer, this provides an electrical connection between the signal transmission line configured as heat-resistant wiring and the sensor unit by pressure bonding. In particular, in order to provide the electrical connection by pressure bonding in a stable manner, the pressure-bonding tip is attached to the end of the signal transmission line configured as heat-resistant wiring. Accordingly, this provides a structure that protects it from being damaged due to an external mechanical force such as tension, vibration, or the like.

The sensor unit 3 outputs transmission/reception of the sensed ultrasonic vibration, pressure, or the like to an external circuit via the signal line attached to the signal line attachment portion 29. In order to attach the signal line, a space having a certain degree of height or size is required between the upper housing portion 7 and the lower housing portion 9. However, in practice, there is no problem in attaching the sensing portion to a measurement target. This allows the sensor sensing portion and the wiring connection portion to be arranged with a predetermined distance between them. This provides a structure so as not to damage the advantages of the sol-gel composite piezoelectric sensor such as flexibility, thin thickness, etc.

Also, assuming that the sensor device 1 is used in a high-temperature environment, all the components, i.e., the sensor unit 3, wiring portion 5, upper housing portion 7, lower housing portion 9, pressure-applying portion 11, and fixing portions $13_1$ and $13_2$, may each be formed of a heat-resistant material. Also, such components may be integrated.

FIGS. 3, 4, 5, and 6 each show an example of the process for actually manufacturing the sensor device.

FIG. 3A shows an MI cable configured as a wiring portion. In this example, the MI cable is configured as a 2-core MI cable having a stainless steel coating with an insulating layer using a ceramic powder. From among the two core lines, one is used as a signal line to transmit an electric signal output from the piezoelectric sensor due to an ultrasonic wave, pressure, or the like. The other is used as a ground line so as to connect the circuit or the like to the ground. Furthermore, the stainless steel coating is connected to the ground.

FIG. 3B shows a state in which the ground core line is welded to the outer tube of the MI cable. FIG. 3C shows a state in which a SUS sheet configured as a pressure-bonding tip is welded to the signal-line core line on the high-voltage side of the MI cable. FIG. 3D shows a state in which the base member of the sensor unit and the external tube of the MI cable are welded.

FIGS. 4A and 4B each show a state in which the upper housing portion and the lower housing portion are attached using rivets such that the sensor unit and the MI cable are interposed between them.

FIGS. 5A and 5B each show a state in which an insulating sheet is arranged in a space between the upper housing portion and the sensor unit. FIG. 5C shows a state in which the core line (pressure-bonding tip) is pressed using an M2 set screw such that it is pressed in contact with the electrode layer with a double nut so as to prevent the loosening of the M2 set screw.

FIG. 6A shows a state in which the MI cable is attached to a coaxial cable connector. The portions denoted by the open circles shown in FIG. 6B are fixed using an acrylic adhesive. As shown in FIG. 6C, this prototype can be used for experiments.

Figure 7:
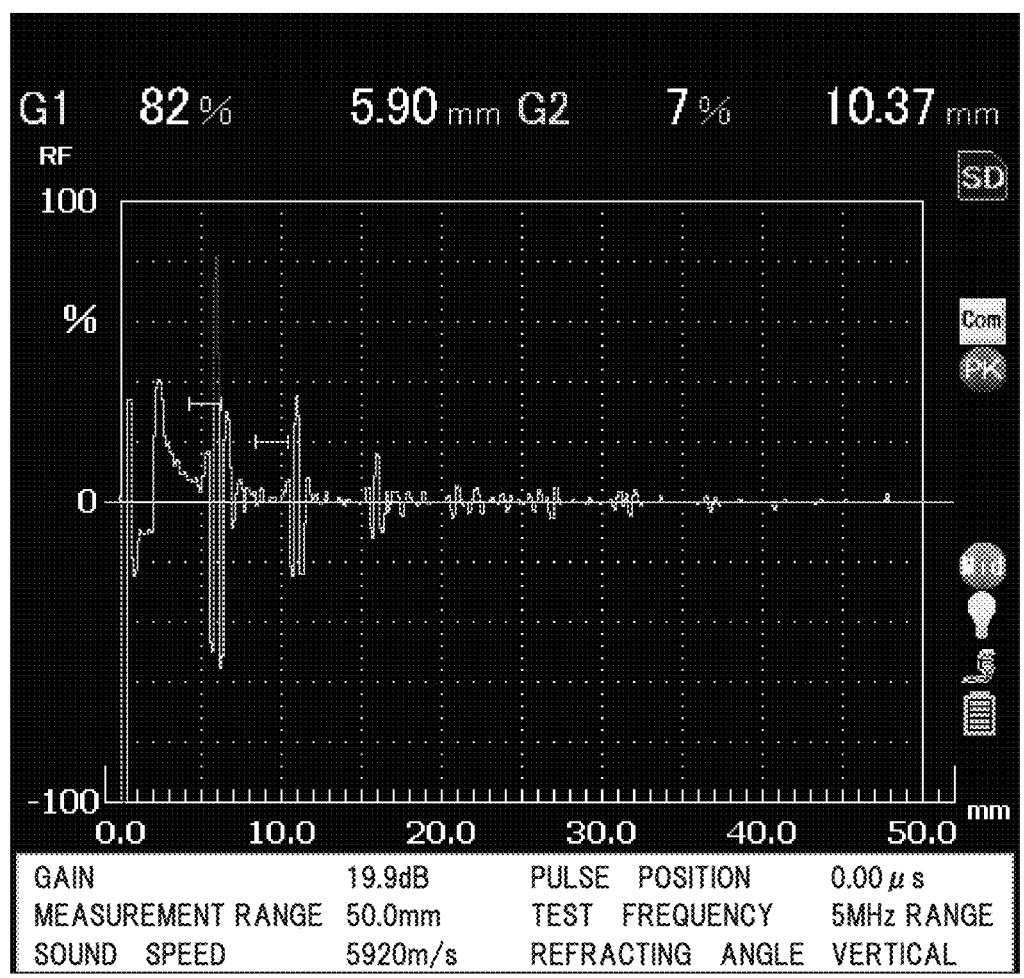
FIG. 7 is a diagram showing measurement results of a prototype.

FIG. 7 shows the measurement results using the prototype. In this experiment, an ultrasonic test piece having a thickness of 5 mm was measured. An ultrasonic pulse echo waveform was successfully acquired. That is to say, it has been confirmed that the wiring connection structure of the sensor device operates effectively.

Figure 8:
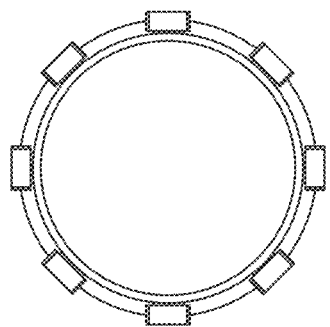
FIG. 8 is a diagram showing an example of a pipe monitoring system for monitoring the sensor device shown in FIG. 1.
Figure 8:
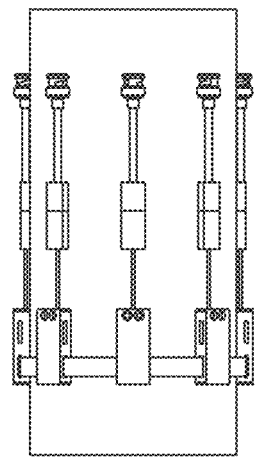
Figure 8:
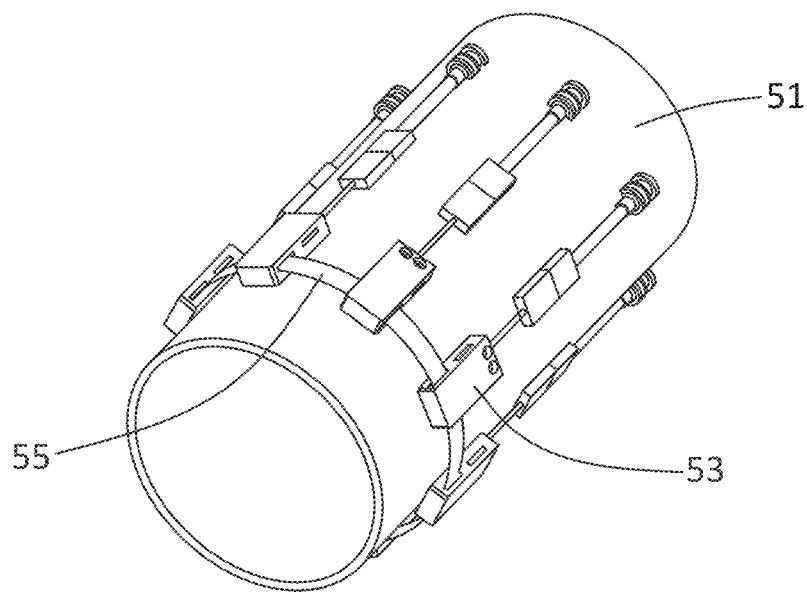

FIG. 8 shows an example of a pipe monitoring system for monitoring a pipe using the sensor device shown in FIG. 1. A pipe 51 is an example of a target object to be tested by the sensor device. The pipe 51 is configured as a 125A steel pipe, for example. Multiple sensor devices are attached to the outer surface of the pipe 51. The attachment unit 53 is arranged such that it covers the sensor unit or the like of the sensor device. A belt portion 55 that passes through the attachment unit 53 is fastened such that it is attached to the outer surface of the pipe 51. This allows the multiple sensor devices to be attached to the outer surface of the pipe 51.

Figure 9:
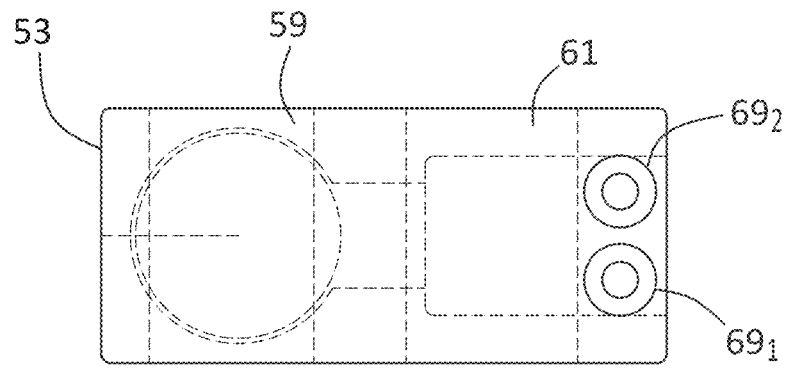
FIG. 9 is a first diagram showing an example of a specific configuration of an attachment unit 53.
Figure 9:
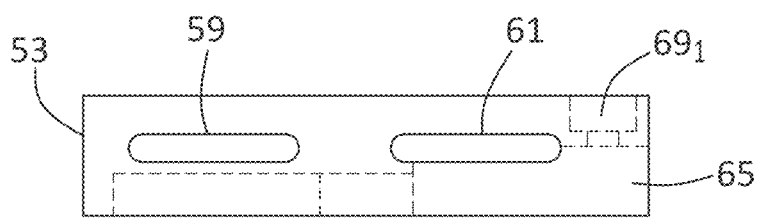
Figure 9:
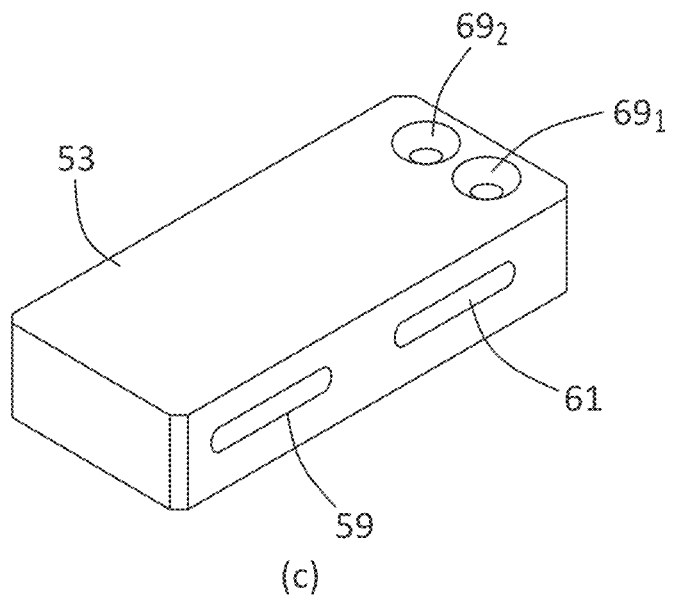
Figure 10:
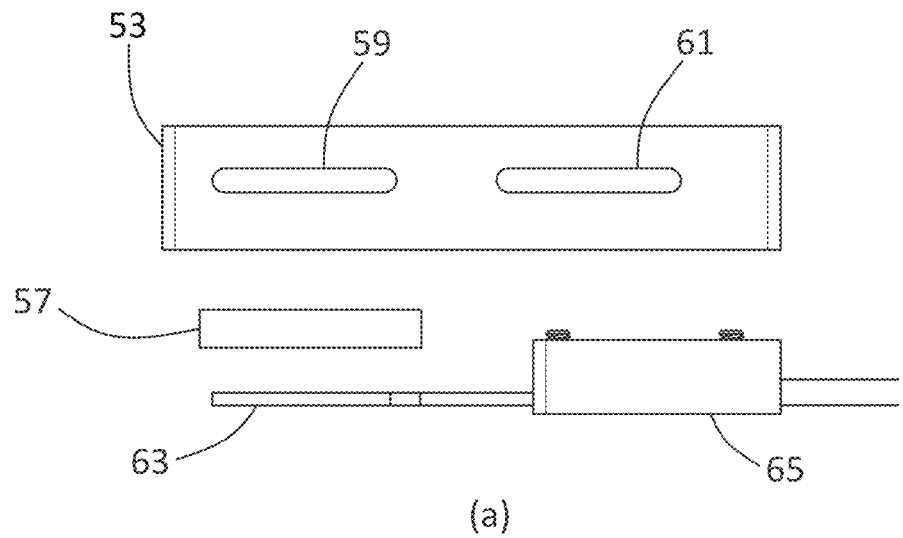
FIG. 10 is a second diagram showing an example of a specific configuration of the attachment unit 53.
Figure 10:
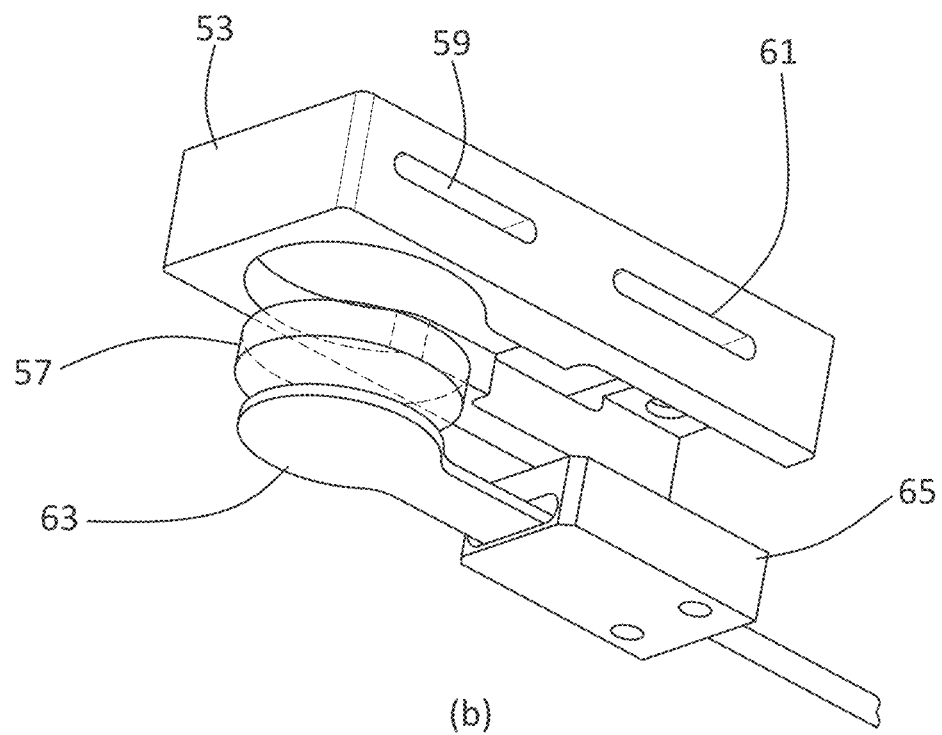

FIGS. 9 and 10 are diagrams each showing an example of a specific configuration of the attachment unit 53. The attachment unit 53 is attached to the sensor device such that it covers the sensor unit 63 and the housing portion 65 (a combination of the upper housing portion and the lower housing portion). The sensor unit 63 has the same configuration as that of the sensor unit 3 shown in FIG. 1. The housing portion 65 has the same configuration as that of a combination of the upper housing portion 7 and the lower housing portion 9 shown in FIG. 1.

The attachment unit 53 is provided with screw holes $69_1$ and $69_2$. This allows the attachment unit 53 and the housing portion 65 to be fixed by two screws using the screw holes $69_1$ and $69_2$ and a screw hole for fixing the upper external portion and the lower housing portion of the housing portion 65. This provides an integrated design of the sensor and the sensor connection portion.

The attachment unit 53 is provided with a first attachment portion 59 and a second attachment portion 61. A belt is arranged and fastened such that it passes through each of the first attachment portion 59 and the second attachment portion 61. This allows the sensor device to be attached to the target object to be tested by the sensor device. Each belt is configured as an all-stainless steel hose clamp, for example. In this example, this allows the sensor device to be attached using a combination of two belts.

The attachment unit 53 includes an adjustment unit 57. The adjustment unit 57 allows the attachment unit 53 to ensure transmission of ultrasonic waves between the target object and the sensor unit 63, and adjusts the space between the attachment unit 53 and the sensor unit 63. The attachment unit 53 is configured as a hose clamp attachment, for example, including an aluminum block or the like. For example, the adjustment unit 57 is configured as a rubber plate (having a cylindrical shape, for example), and compresses the sensor unit. The adjustment unit 57 includes a cutoff portion that cuts off reflected waves from the adjustment unit 57. The cutoff portion is configured as an insulating sheet (material that is capable of cutting off ultrasonic waves), for example. The cutoff portion is arranged such that it is interposed between the Loctite and the rubber plate so as to prevent the reflected waves from the rubber plate from being detected.

Figure 11:
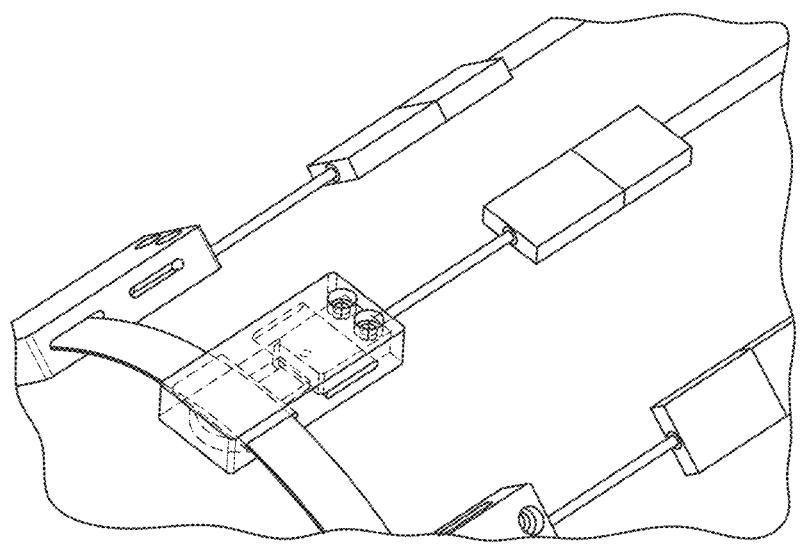
FIG. 11 shows a state in which the attachment unit and the sensor device are attached to a pipe.

FIG. 11 shows a state in which the attachment units and the sensor devices are attached to the pipe.

Figure 12:
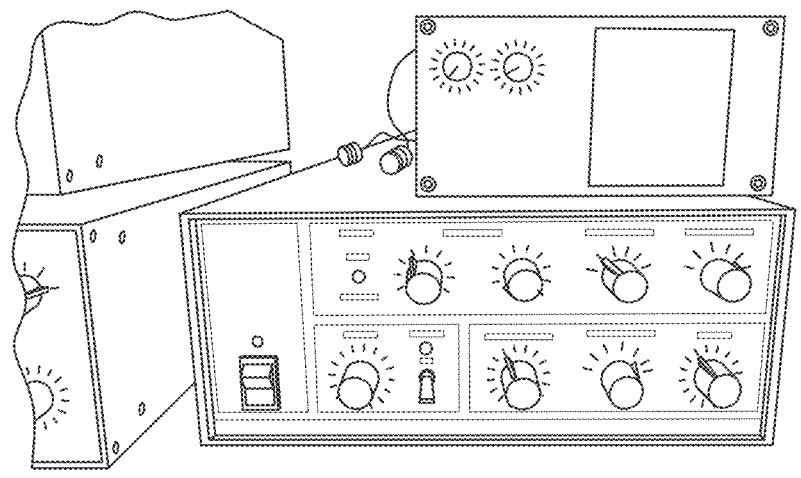
FIG. 12 is a first diagram for explaining a pipe wall thinning monitoring experiment performed by the present inventors.
Figure 12:
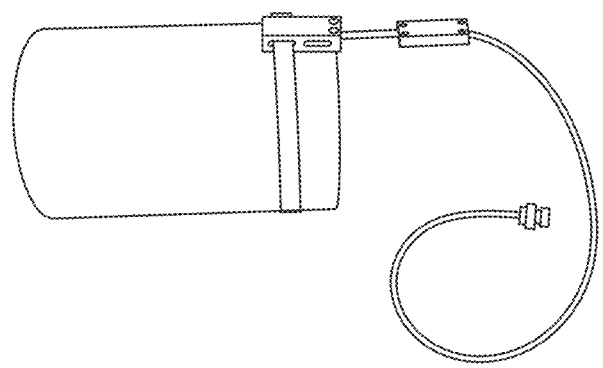
Figure 13:
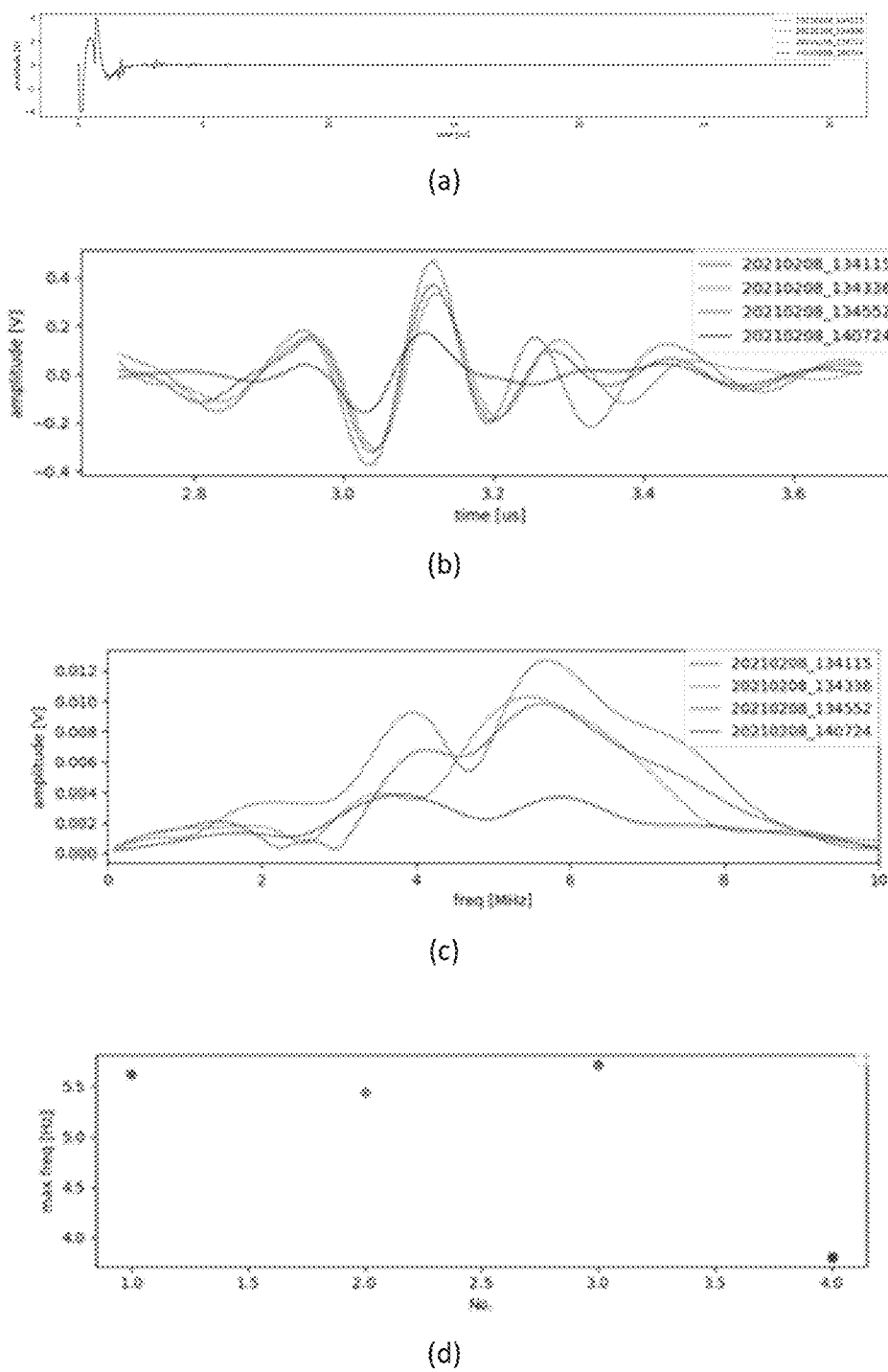
FIG. 13 is a second diagram for explaining a pipe wall thinning monitoring experiment performed by the present inventors.

FIGS. 12 and 13 are diagrams for explaining an experiment for monitoring wall thinning in a pipe that was performed by the present inventors.

FIG. 12 shows (a) an ultrasonic processing apparatus used in the experiment, and (b) a state in which the sensor device is attached to a pipe using the attachment unit. A signal line of the sensor device shown in FIG. 12B is connected to the ultrasonic processing apparatus shown in FIG. 12. With this, ultrasonic waves are generated, and the reflected waves from the pipe are detected by the sensor device. This is capable of monitoring the wall thinning of the pipe.

In this experiment, in order to evaluate the effects of the hardness of the rubber plate to be used to fix the sensor device, such an arrangement was compared with a case in which the sensor unit is fixed using self-adhesive tape and a hose band. As the measurement target, a 125A (5 inch) SUS pipe was used. The data names 20210208_134115, 20210208_134336, and 20210208_134552 correspond to the experiments using rubber plates having rubber strengths of 30, and 40, respectively. The data name 20210208_140724 corresponds to the experiment in which the sensor unit is fixed using self-adhesive tape and a hose band. The data numbers 1 through 4 correspond to the data names 20210208_134115, 20210208_134336, 20210208_134552, and 20210208_140724, respectively.

FIG. 13A shows the amplitude of the voltage (vertical axis, in volts) detected with respect to the passage of time (horizontal axis, in microseconds). FIG. 13B is an enlarged view of FIG. 13A in the vicinity of 2.8 to 3.6µ seconds. FIG. 13C shows the amplitude (vertical axis, in volts) plotted against the frequency (horizontal axis, in MHz).

FIG. 13D shows the maximum frequency (Hz) (vertical axis) with respect to each data number (horizontal axis). The data number 1 shows a maximum frequency of 5.63 Hz and a maximum amplitude of 0.37 V. The data number 2 shows a maximum frequency of 5.45 Hz and a maximum amplitude of 0.33 V. The data number 3 shows a maximum frequency of 5.72 Hz and a maximum amplitude of 0.47 V. In contrast, the data number 4 shows a maximum frequency of 3.81 Hz and a maximum amplitude of 0.17 V.

In all the data numbers, ultrasonic waves could be detected. Furthermore, such an arrangement in which the sensor device is fixed using the rubber plate provides detection with improved accuracy as compared with an arrangement in which the sensor device is fixed using self-adhesive tape and a hose band. Accordingly, with an arrangement employing an elastic member such as a rubber plate as the adjustment unit 57, it is anticipated that such an arrangement provides improved accuracy.

REFERENCE SIGNS LIST

1 sensor device, 3 sensor unit, 5 wiring portion, 7 upper housing portion, 9 lower housing portion, 11 pressure-applying portion, 13$_1$, 13$_2$ fixing portion, 15 wiring connector portion, 21 base material layer, 23 piezoelectric film layer, 25 electrode layer, 27 protective layer, 29 signal line attachment portion, 31 ground line attachment portion, 33 pressure-bonding tip, 35 insulating layer, 51 pipe, 53 attachment unit, 55 belt portion, 57 adjustment unit, 59 first attachment portion, 61 second attachment portion, 63 sensor unit, 65 housing portion, 69$_1$, 69$_2$ screw hole.

The invention claimed is:

1. A sensor device having a structure in which a sensor unit is connected to a wiring portion,
    wherein the sensor unit is configured as a sol-gel composite piezoelectric sensor, and is provided with a piezoelectric film layer, an electrode layer formed on the piezoelectric film layer, and a protective layer,
    wherein the electrode layer is covered by the protective layer except for a portion of the electrode layer,
    wherein a portion of the electrode layer that is not covered by the protective layer is flat,
    wherein the wiring portion includes a signal line,
    wherein the signal line is structured with an end including a pressure bonding tip having a flat portion,
    wherein a housing portion is provided so as to cover a portion of the electrode layer that is not covered by the protective layer and an uncovered portion of the signal line,
    and wherein the housing portion is provided with a pressure-applying portion configured to press the flat portion of the pressure-bonding tip to the portion of the electrode layer that is not covered by the protective layer so as to provide pressure bonding.

2. The sensor device according to claim 1, wherein the sensor unit includes a base material layer,
    wherein the piezoelectric film layer is formed on the base material layer,
    wherein the base material layer is covered by the protective layer except for a portion of the base material layer,
    wherein the wiring portion includes a ground line,
    and wherein the ground line is electrically connected to a portion of the base material layer that is not covered by the protective layer.

3. The sensor device according to claim 1, wherein the wiring portion has one end electrically connected to the sensor unit, and the other end electrically connected to an extended wiring portion,
    and wherein the sensor unit, the wiring portion, and the pressure-applying portion each have a heat-resistance temperature that is higher than a heat-resistance temperature of the extended wiring portion.

4. The sensor device according to claim 1, comprising an attachment unit structured to cover at least the sensor unit,
    wherein the attachment unit comprises an attachment portion to be attached to a target object.

5. The sensor device according to claim 4, wherein the attachment unit is structured to ensure transmission of ultrasonic waves between the target object and the sensor unit via the attachment unit, and includes an adjustment unit configured to adjust a connection between the attachment unit and the sensor unit,
    and wherein the adjustment unit comprises a cutoff portion structured to cut off reflected waves from the adjustment unit.

6. A method for manufacturing a sensor device having a structure in which a sensor unit is connected to a wiring portion,
    wherein the sensor unit is configured as a sol-gel composite piezoelectric sensor, and is provided with a piezoelectric film layer, an electrode layer formed on the piezoelectric film layer, and a protective layer,
    wherein the electrode layer is covered by the protective layer except for a portion of the electrode layer,
    wherein a portion of the electrode layer that is not covered by the protective layer is flat,
    wherein the wiring portion includes a signal line,
    wherein the signal line is structured with an end including a pressure bonding tip having a flat portion,
    wherein the method comprises:
        housing, in which a housing portion provided to the sensor device is applied so as to cover a portion of the electrode layer that is not covered by the protective layer and an uncovered portion of the signal line; and pressing, in which the a pressure-applying portion provided to the housing portion is applied so as to press the flat portion of the pressure-bonding tip to the portion of the electrode layer that is not covered by the protective layer so as to provide pressure bonding.

\* \* \* \* \*